US012347807B2

United States Patent
Kabir et al.

(10) Patent No.: US 12,347,807 B2
(45) Date of Patent: Jul. 1, 2025

(54) INORGANIC FILL MATERIAL FOR STACKED DIE ASSEMBLY

(71) Applicant: Intel Corporation, Santa Clara, CA (US)

(72) Inventors: Mohammad Enamul Kabir, Portland, OR (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 680 days.

(21) Appl. No.: 17/558,265

(22) Filed: Dec. 21, 2021

(65) Prior Publication Data

US 2023/0197678 A1    Jun. 22, 2023

(51) Int. Cl.
| | |
|---|---|
| H01L 25/065 | (2023.01) |
| H01L 23/00 | (2006.01) |
| H01L 23/31 | (2006.01) |
| H01L 23/498 | (2006.01) |

(52) U.S. Cl.
CPC ...... *H01L 25/0652* (2013.01); *H01L 23/3128* (2013.01); *H01L 23/49816* (2013.01); *H01L 24/16* (2013.01); *H01L 25/0657* (2013.01); H01L 2924/15311 (2013.01)

(58) Field of Classification Search
CPC ............. H01L 25/0652; H01L 23/3128; H01L 23/49816
See application file for complete search history.

(56) References Cited

U.S. PATENT DOCUMENTS

| | | | | |
|---|---|---|---|---|
| 5,151,776 A * | 9/1992 | Wojnarowski | ...... | H01L 23/5389 257/713 |
| 6,794,273 B2 * | 9/2004 | Saito | ................. | H01L 23/49822 257/E21.705 |
| 7,701,040 B2 * | 4/2010 | Huang | ................. | H01L 21/563 257/659 |
| 8,105,875 B1 * | 1/2012 | Hu | .................... | H01L 23/49827 438/107 |
| 8,872,312 B2 * | 10/2014 | Wang | ................... | H01L 21/565 257/53 |
| 10,770,365 B2 * | 9/2020 | Yu | .......................... | H01L 24/32 |
| 11,233,035 B2 * | 1/2022 | Chen | ................... | H01L 25/0657 |
| 11,276,620 B2 * | 3/2022 | Chang | ................. | H01L 21/6835 |
| 11,527,501 B1 * | 12/2022 | Elsherbini | ............... | H01L 23/15 |
| 11,915,992 B2 * | 2/2024 | Jeng | .................... | H01L 21/4871 |
| 12,165,962 B2 * | 12/2024 | Aleksov | ................ | H01L 23/564 |

(Continued)

FOREIGN PATENT DOCUMENTS

| | | | | | |
|---|---|---|---|---|---|
| CN | 113517269 A | * | 10/2021 | ............ | H01L 21/50 |
| CN | 114695279 A | * | 7/2022 | ............ | H01L 21/56 |

(Continued)

*Primary Examiner* — Laura M Menz
(74) *Attorney, Agent, or Firm* — Essential Patents Group, LLP

(57) ABSTRACT

A microelectronic package structure with inorganic fill material having a first die with a second and an adjacent third die on the first die. Each of the second and third die comprise hybrid bonding interfaces with the first die. A first layer is on a region of the first die between the second and third dies. A second layer is over the first layer, the second layer comprising an inorganic dielectric material, wherein a top surface of the second layer is substantially coplanar with top surfaces of the second and third dies.

10 Claims, 14 Drawing Sheets

(56) References Cited

U.S. PATENT DOCUMENTS

| | | | |
|---|---|---|---|
| 12,224,261 B2* | 2/2025 | Liff | H01L 24/81 |
| 2013/0044554 A1* | 2/2013 | Goel | G11C 29/816 |
| | | | 365/200 |
| 2013/0082364 A1* | 4/2013 | Wang | H01L 25/0655 |
| | | | 257/659 |
| 2014/0273354 A1* | 9/2014 | Ramaswami | H01L 23/49811 |
| | | | 438/126 |
| 2015/0262902 A1* | 9/2015 | Shen | H01L 23/147 |
| | | | 438/107 |
| 2017/0040237 A1* | 2/2017 | Shen | H01L 23/49838 |
| 2018/0130717 A1* | 5/2018 | Shen | H01L 23/481 |
| 2021/0202336 A1* | 7/2021 | Chang | H01L 24/32 |
| 2022/0093517 A1* | 3/2022 | Aleksov | H01L 23/5385 |
| 2022/0093725 A1* | 3/2022 | Elsherbini | H01L 24/08 |
| 2022/0181232 A1* | 6/2022 | Jeng | H01L 25/50 |
| 2022/0189839 A1* | 6/2022 | Eid | H01L 21/56 |
| 2022/0189850 A1* | 6/2022 | Liff | H01L 23/49816 |
| 2022/0189861 A1* | 6/2022 | Aleksov | H01L 24/32 |
| 2022/0192042 A1* | 6/2022 | Kabir | H01L 23/5383 |
| 2022/0208723 A1* | 6/2022 | Katkar | H01L 25/16 |
| 2023/0100228 A1* | 3/2023 | Pasdast | H01L 25/0657 |
| | | | 257/668 |
| 2023/0197637 A1* | 6/2023 | Mallik | H01L 25/0652 |
| | | | 257/700 |
| 2023/0197678 A1* | 6/2023 | Kabir | H01L 24/16 |
| | | | 257/686 |
| 2023/0197685 A1* | 6/2023 | Karhade | H01L 24/80 |
| | | | 257/777 |
| 2023/0260978 A1* | 8/2023 | Kuo | H10F 71/121 |
| | | | 257/432 |
| 2024/0006366 A1* | 1/2024 | Morein | H01L 25/105 |
| 2024/0063133 A1* | 2/2024 | Elsherbini | H01L 25/0652 |
| 2024/0128196 A1* | 4/2024 | Liao | H01L 23/642 |
| 2024/0222320 A1* | 7/2024 | Nad | H01L 25/18 |
| 2024/0339410 A1* | 10/2024 | Aleksov | H01L 23/49 |
| 2024/0379564 A1* | 11/2024 | Wu | H01L 25/0655 |
| 2024/0429145 A1* | 12/2024 | Jain | H01L 23/49827 |
| 2025/0006678 A1* | 1/2025 | Karhade | H01L 24/80 |

FOREIGN PATENT DOCUMENTS

| | | | | |
|---|---|---|---|---|
| CN | 114695280 A | * | 7/2022 | H01L 23/3731 |
| CN | 116314052 A | * | 6/2023 | H01L 21/56 |
| CN | 116438653 A | * | 7/2023 | B81B 7/007 |
| CN | 222380573 U | * | 1/2025 | H01L 21/4857 |
| DE | 102017122831 A1 | * | 5/2018 | H01L 21/486 |
| DE | 102022132152 A1 | * | 6/2023 | H01L 21/56 |
| EP | 3971961 A1 | * | 3/2022 | H01L 23/482 |
| EP | 3971964 A2 | * | 3/2022 | H01L 22/14 |
| EP | 4016595 A1 | * | 6/2022 | B81B 7/0006 |
| EP | 4016607 A1 | * | 6/2022 | H01L 21/56 |
| EP | 4016615 A1 | * | 6/2022 | H01L 23/3731 |
| EP | 4303925 A1 | * | 1/2024 | H01L 24/19 |
| JP | 2022094913 A | * | 6/2022 | H01L 21/56 |
| WO | WO-2018125767 A2 | * | 7/2018 | H01L 21/76898 |
| WO | WO-2022060515 A1 | * | 3/2022 | H01L 23/13 |
| WO | WO-2022132273 A1 | * | 6/2022 | B81B 7/007 |
| WO | WO-2022132274 A1 | * | 6/2022 | H01L 21/568 |
| WO | WO-2022147460 A1 | * | 7/2022 | H01L 21/4803 |

* cited by examiner

INORGANIC FILL MATERIAL FOR STACKED DIE ASSEMBLY

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Multiple die can be assembled into a single IC package. In some multi-die packages, die may be stacked upon each other wherein the various stacked die may be interconnected through a package substrate. Such stacked die units may advantageously combine IC die from heterogeneous silicon processes and/or combine small dis-aggregated die from the same silicon process. However, there are many challenges with integrating multiple IC die (including die stacked upon each other) into a package assembly. One issue is the structural/mechanical strength of the stacked-die unit. For example, stacked die units may exhibit less than optimal thermal performance because, compared to a monolithic IC die (e.g., one having approximately the same footprint of a multi-die unit), the various small IC die assembled together are less capable of spreading heat across the assembled package, at least in part, to relatively poor thermal conductivity in regions between top die and a bottom die. For example, a mold material that might backfill between the IC top die may have a thermal conductivity of only around 2.5 W/mK, or less.

Utilizing a mold material in a space above a bottom die/dies and between top die in a stacked die assembly can cause high stress in the bottom die/dies at these locations. Transistor performance loss due to packaging can be seen in the mold filled areas on the bottom die. Such package-induced stresses can impact transistor carrier mobility. This stress can cause significant shifts in device characteristics for packaged components. Device parametric shifts may affect circuit timings sufficiently to degrade overall component performance or functionality. In 3D stacked die packages this performance shift can occur in both top and bottom die. However, the highest impact often seen is in the bottom die at the open space between the top die.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
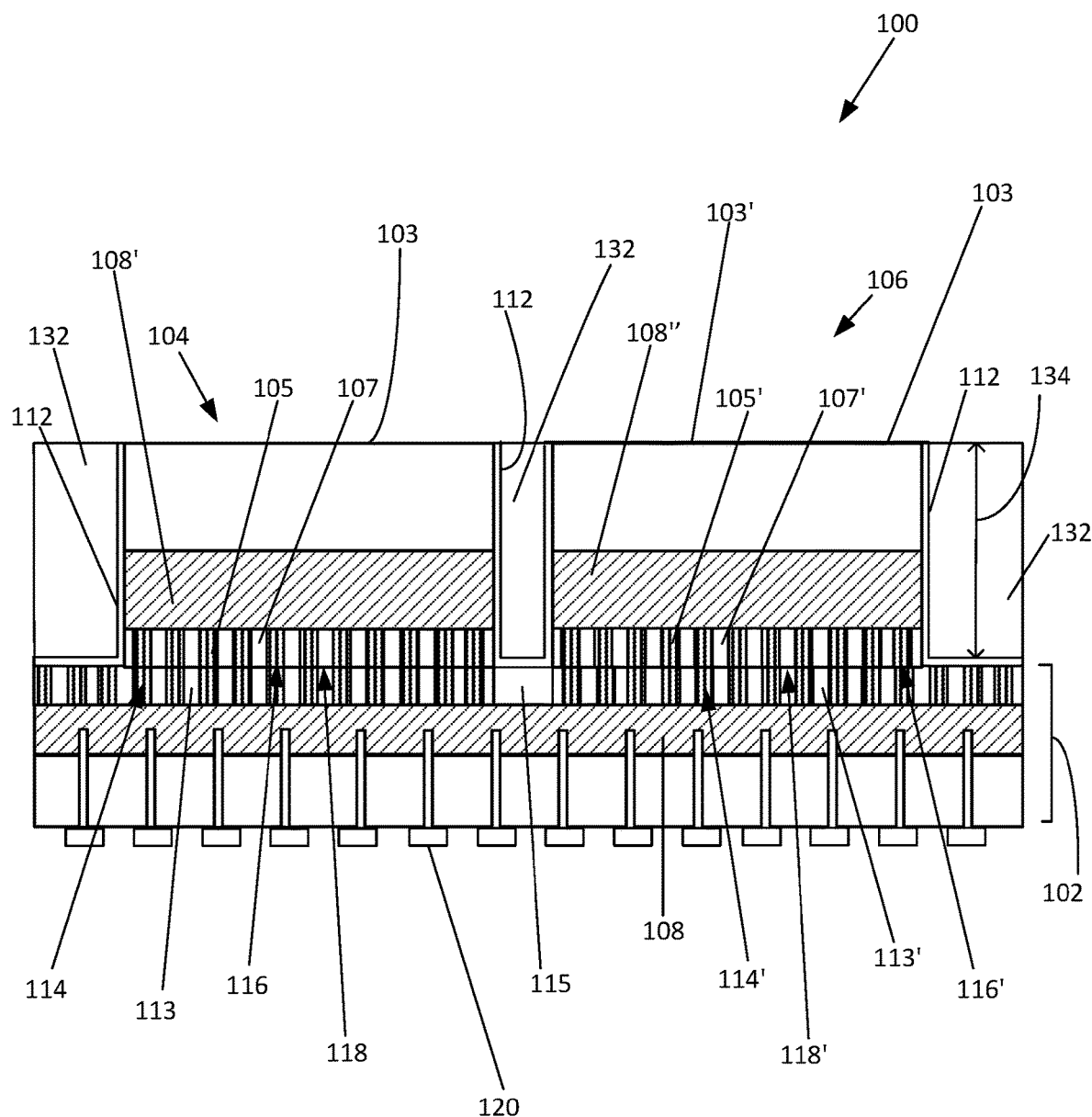
FIG. 1 is a cross-sectional view of a multi-chip stack assembly comprising an inorganic fill material, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate as well as layers within die/devices coupled to the package substrate. Dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Stacked die assemblies having an inorganic fill material according to embodiments are described herein. A microelectronic package structure having a first die with a second and an adjacent third die on the first die. Each of the second and third die comprise hybrid bonding interfaces with the first die. A first layer is on a region of the first die between the second and third dies. A second layer is over the first layer, the second layer comprising an inorganic dielectric material, wherein a top surface of the second layer is substantially coplanar with the top surfaces of the second and third dies. The second layer provides reduction of package-induced stresses which can impact the transistor carrier mobility.

FIG. 1 is a cross-sectional view of a microelectronic package structure 100 comprising an inorganic dielectric fill material, according to some embodiments. The stacked die package structures described herein may be assembled and/or fabricated with one or more of the features or attributes provided in accordance with various embodiments. A number of different assembly and/or fabrication methods may be practiced to generate a stacked die unit having one or more of the features or attributes described herein.

A first die 102 may comprise a base die to which any number of additional die may be placed upon, in some embodiments. The first die 102 may comprise any integrated circuitry fabricated according to any microelectronic technology such as complementary metal oxide semiconductor (CMOS), SiGe, III-V or III-N HEMTs, etc.). The first die 102 may comprise a bulk silicon region and an active region, wherein the active region may comprise circuitry structures including metal routing layers within dielectric layers. The first die 102 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

The first die 102 comprises a first die dielectric material 113 between one or more first die conductive structures 114. The first die conductive structures 114 may be made of any appropriate conductive material, including but not limited to, metals, such as copper, silver, nickel, gold, aluminum, alloys thereof, and the like. The first die 102 may comprise conductive pads 120 on a surface of the first die 102 opposite the first die conductive structures 114, that may be made of any appropriate conductive material, including but not limited to, metals, such as copper, silver, nickel, gold, aluminum, alloys thereof, and the like.

In an embodiment, the first die dielectric material 113 may comprise silicon dioxide. The first die conductive structures 114 may be formed by any known process, including but not limited to plating. Plating processes, such as electroplating and electroless plating, are well known in the art and, for purposes of clarity and conciseness, will not be discussed herein.

A second die 104 and a third die 106 may comprise second die conductive structures 105 and third die conductive structures 105' respectively. The second die 104 and third die 106 may comprise a bulk silicon region and an active region, wherein the active region may comprise circuitry structures including metal routing layers within dielectric layers. The second and third die 104, may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. Individual ones of the second die conductive structures 105 are separated by second die dielectric material 107. Third die conductive structures 105' are separated by third die dielectric material 107'. First die dielectric material 113 is directly on the second die dielectric material 107 and is directly on the third die dielectric material 107'.

An interface region 118 between the first die dielectric material 113 and the second and third dielectric materials 107, 107' may comprise an insulator-insulator bonded region and may comprise a portion of a hybrid bond. An interface region 116 between the first die conductive structures 114 and the second and third conductive structures 105, 105' may comprise a metal-metal bonded region and may comprise a portion of a hybrid bond. In the hybrid bond, dielectric portions are bonded together with Van Der Waals forces, while metal to metal bonds are formed by temperature processing to be further described herein.

A first layer 112 may be on sidewalls of the second and third dies 104, 106 in some embodiments. The first layer 112 may also be on a region of the first die 102 between the second die 104 and the third die 106. The first layer 112 may optionally be on a top surface 103 of the second die 104 and on top surface 103' of the third die 106 (as shown in FIG. 2E, for example). In some embodiments, the first layer 112 comprises an inorganic dielectric material. In some embodiments, the first layer is a single layer, wherein the layer comprises a single compound, such as a single layer of silicon nitride, for example. In some embodiments the first layer may comprise a single layer of a silicon oxynitride material. The first layer may comprise an etch stop layer in some embodiments. In some embodiments, the first layer may comprise silicon carbon nitride, polyimide materials, or combinations thereof.

A second layer 132 is directly on the first layer 112. In an embodiment there are no intervening layers between the first layer 112 and the second layer 132. In some embodiments, the second layer 132 may comprise an inorganic dielectric material. In some embodiments, the second layer 132 may comprise silicon and oxygen, and may comprise such materials as silicon dioxide, spin on glass, alumina or any combination thereof, as well as including any dopant materials such as boron and/or phosphorus etc. In some embodiments, the second layer 132 may comprise a height 134 which may be substantially coplanar with top surfaces 103, 103' on the second die 104 and the third die 106. In some embodiments, the second layer 132 is over the first die 102 in a region 115 between the second and third dies 104, 106.

In some embodiments, the second layer 132 comprises an inorganic dielectric material that is different than the inorganic dielectric material of the first layer 112. In some embodiments, the second layer 132 comprises a coefficient of thermal expansion (CTE) that is within about 10 percent of a CTE of the first, second and third die 102, 104, 106. In some embodiments, the CTE of the second layer 132 may be within about 10 percent of a CTE of silicon, approximately 2.8 PPM/degrees Celsius. In some embodiments, the second layer 132 is a single layer of substantially uniform composition. In some embodiments, the second layer 132 comprises a stress relief layer (or may comprise multiple layers for increased stress relief)) between the second die 104 and third die 106. The second layer 132 reduces stress between the first die 102 and any number of dies that are on the first die 102, such as the second and third dies 104, 106, due to CTE matching between the second die 104, third die 106 and the first die 102. The second layer 132 reduces any stress discontinuity between top dies (such as dies 104, 106) on the bottom die 102 and protects the first die 102 from this stress discontinuity. Thus, the second layer 132 bears the stress load and the first die 102 is relieved of the stress discontinuity.

In some embodiments, active layers 108, 108', 108" of first, second and third dies 102, 104, 106 respectively may comprise circuit components such as transistors and/or various passive elements such as inductors or resistors, and the like. The second layer 132 reduces 3D stacking related package stress which may impact a transistor carrier mobility, such as may be present when using a mold material as a fill material instead of when using the second layer 132 as a fill material. Shifts in device characteristics for packaged components relative to wafer level characteristics are reduced by using the second layer as an inorganic fill material. Device parametric shifts may affect circuit timings sufficiently to degrade overall component performance or functionality. Therefore, package level device performance shifts are reduced by using the second layer 132 and therefore device reliability and performance are enhanced according to embodiments herein.

Figure 2A:
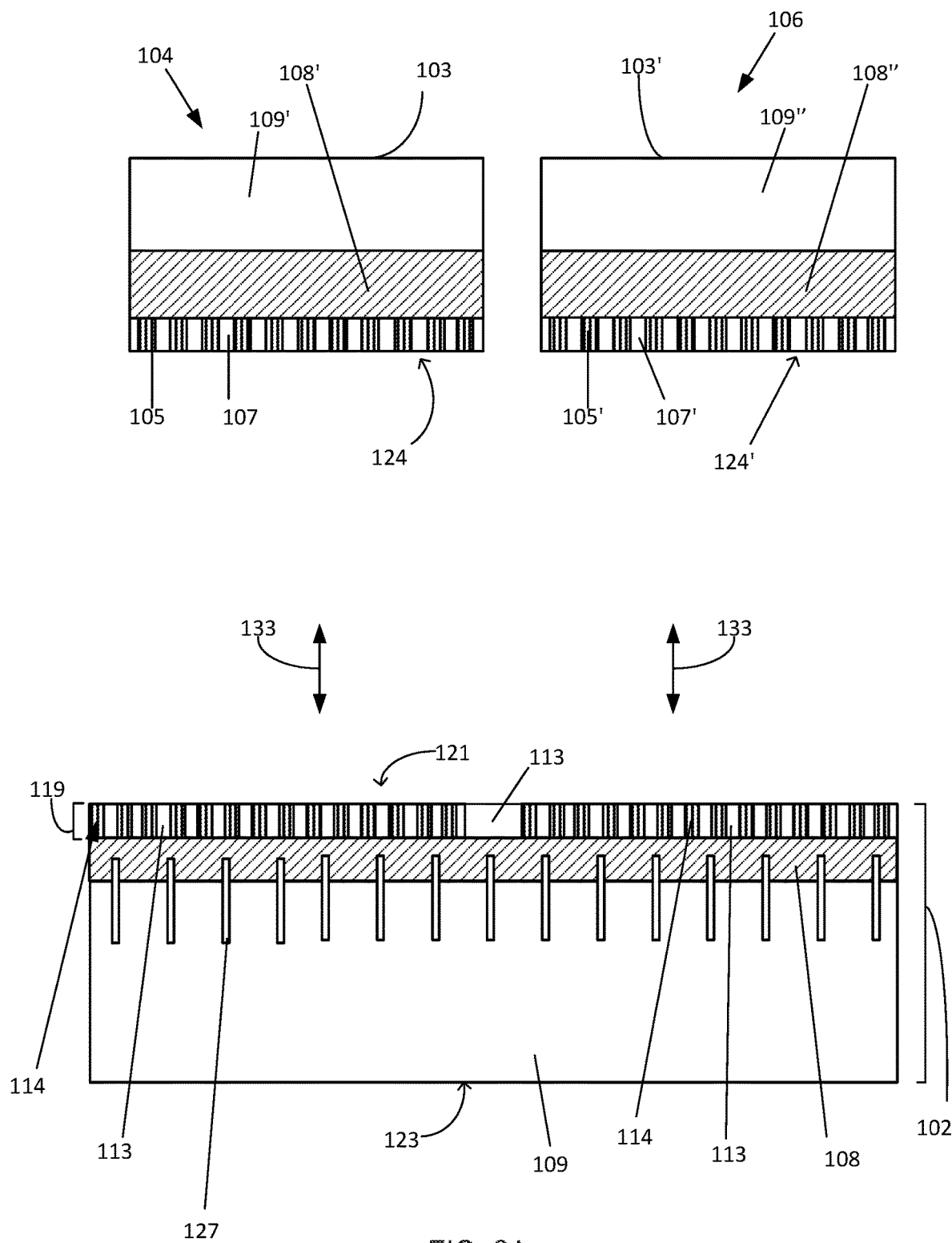
FIGS. 2A-2G illustrate cross-sectional views of forming stacked die assemblies comprising and inorganic fill material, in accordance with some embodiments.
Figure 2B:
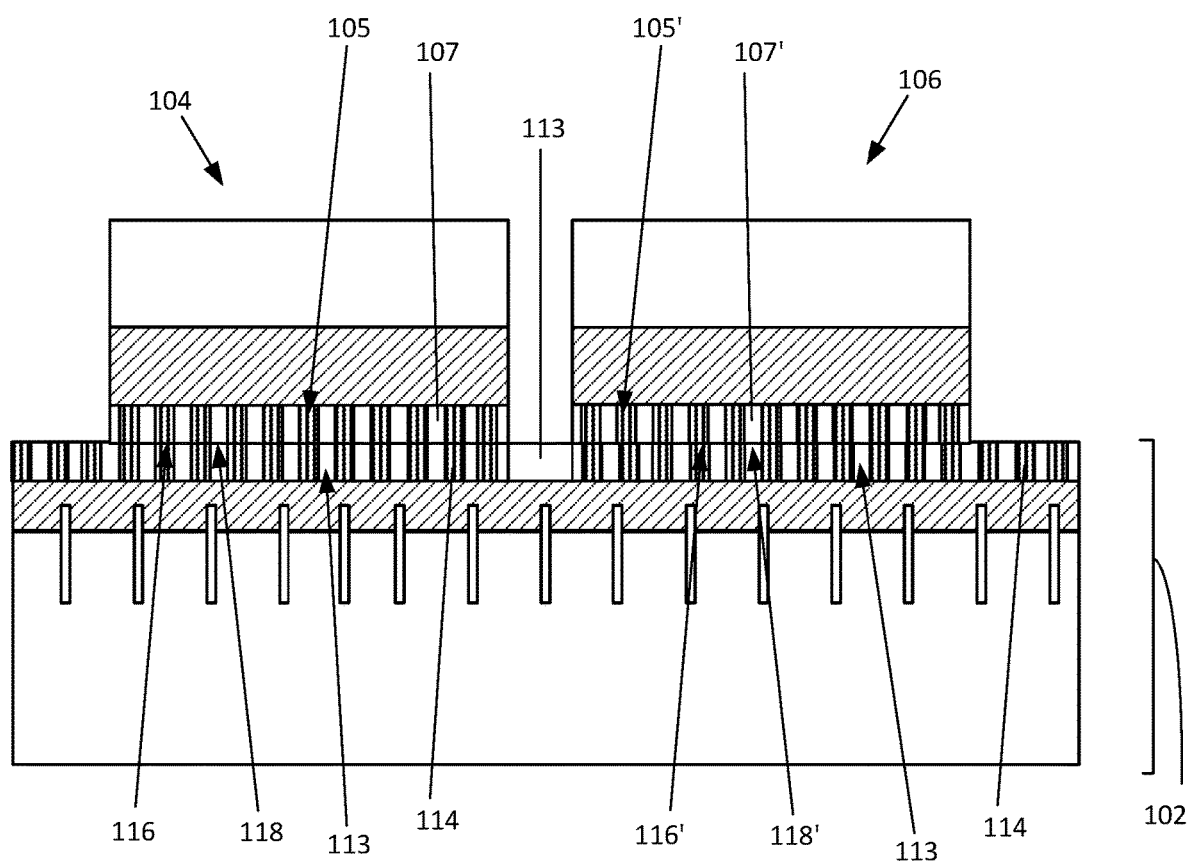
Figure 2C:
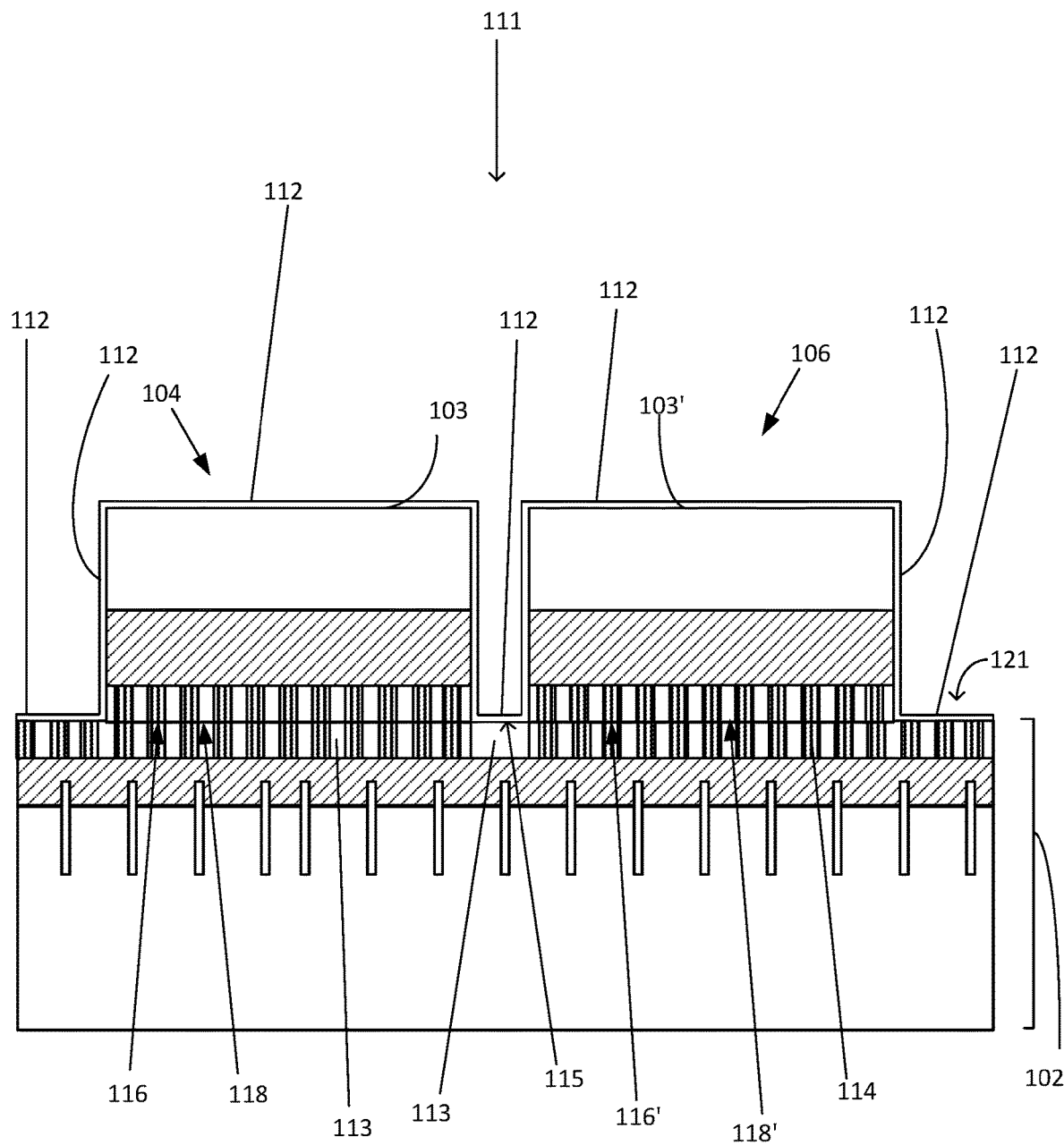
Figure 2D:
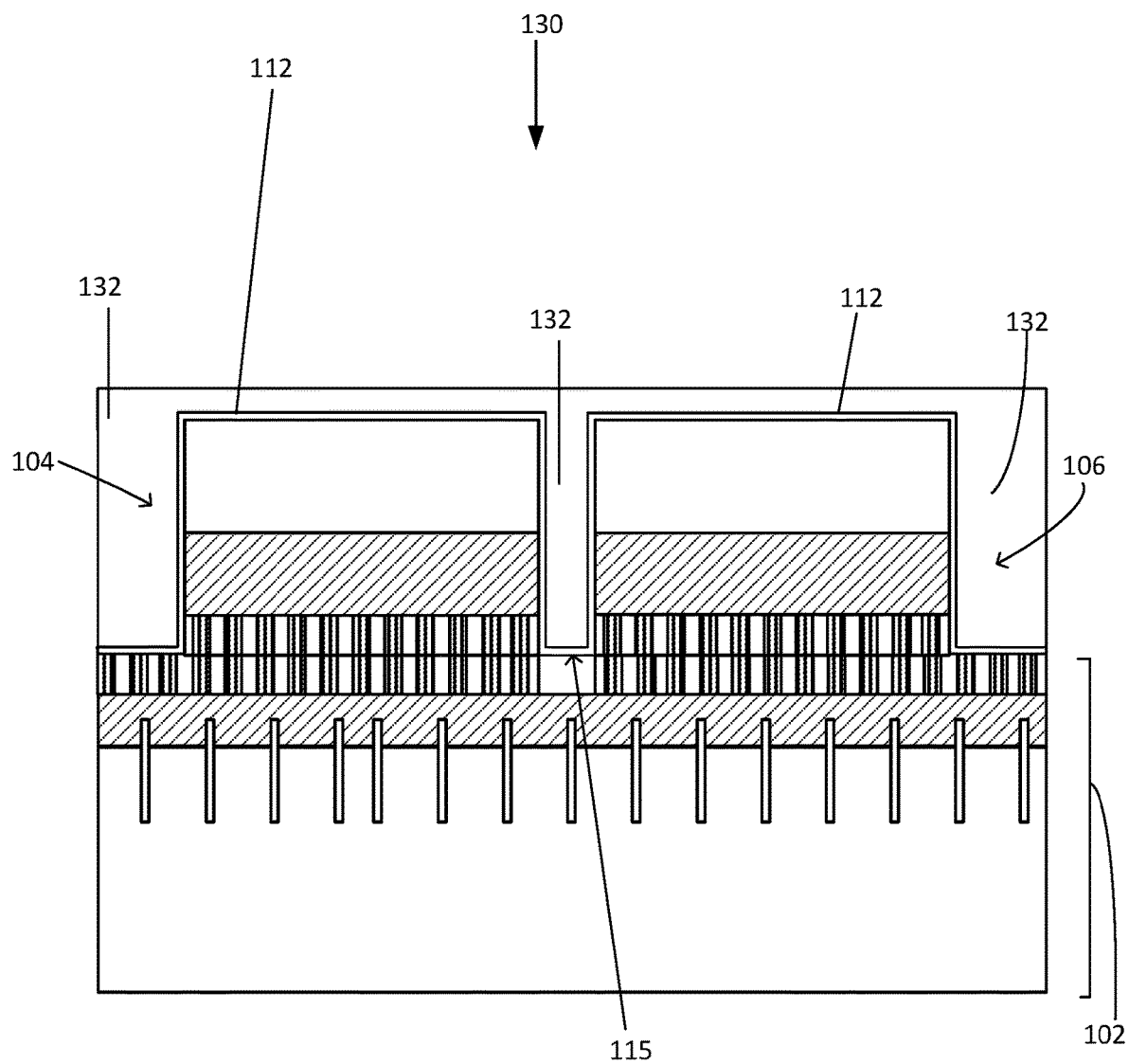
Figure 2E:
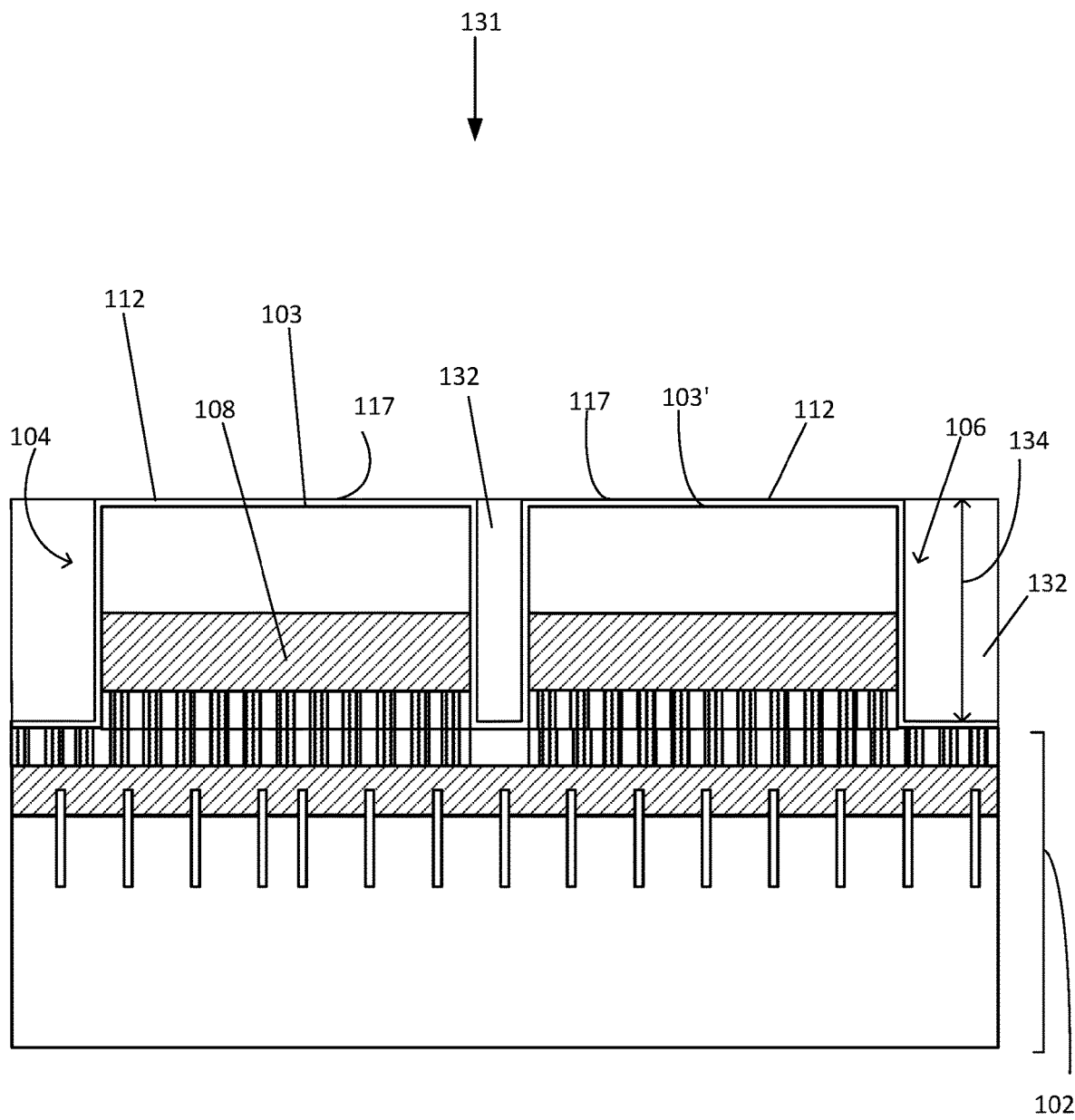

FIGS. 2A-2G depict the assembly of a stacked die package structure according to some embodiments. In FIG. 2A, a first die 102 may be provided for assembly of a stacked die package structure. The first die 102 may comprise a first side 121 and a second side 123. The first die 102 may comprise any type of functionality, such as a graphics die, or a logic die, for example. An active region 108 is over a bulk silicon portion 109 of the first die 102. One or more first die conductive structures 114 may be over the active area 108. The one or more first die conductive structures 114 may be separated by a first die dielectric material 113 and may comprise a first die bond layer 119. The one or more first die conductive structures 114 may comprise copper, in some embodiments, but may comprise any suitable conductive materials or alloys thereof. The first die dielectric material 113 may comprise silicon and oxygen, in some embodiments. In some embodiments, the first die dielectric material 113 may comprise any suitable dielectric material.

The first die 102 comprises conductive via structures 127 coupled to circuit components located in the active area 108, according to some embodiments. The conductive via structures may extend partially into a bulk silicon region 108 of the first die 102. A second die 104 may comprise a first side 124 and a second side 103, and a third die 106 may comprise a first side 124' and a second side 103'.

First sides 124, 124' of the second die 104 and the third die 106 may be attached to the first side 121 of the first die 102 using a die attach process 133. The die attach process may comprise a hybrid bonding die attach process, in some embodiments. The second die 104 may comprise second die conductive structures 105, and the third die 106 may comprise third die conductive structures 105'. The second die conductive structures 105 may be placed on the first die conductive structures 114, and the third die conductive structures 105' may be placed on the first die conductive structures 114. Also, second die dielectric material 107 and third die dielectric material 107' may be placed on the first die dielectric material 113.

The attachment process 133, which may comprise a hybrid bonding process, first bonds the second die dielectric material 107 (located on a first side 124 of the second die 104) and the third die dielectric material 107' (located on the first side 124' of the third die 106) to the first die dielectric material 113 through the creation of van der Waals adhesion between the dielectric materials. In some embodiments, the first, second and third dielectric materials 113, 107, 107' may comprise such dielectric materials as interlayer dielectric materials (ILDs) such as but not limited to dielectric materials comprising silicon, carbon nitrogen or oxygen.

Secondly, through high temperature fusion bonding between first, second and third die conductive structures 114, 105, 105' metal bonding may occur at interface regions between the first die conductive structures 114 and the second and third die conductive structures 105, 105'.

FIG. 2B depicts the first, second and third dies 102, 104, 106 subsequent to undergoing the attachment process 133 of FIG. 2A. Metal to metal bonds have been formed at interface regions/mating surfaces 116, 116' between the first die conductive structures 114 and the second and third die conductive structures 105, 105'. Insulator to insulator bonds between the first die dielectric material 113 and the second and the third die dielectric material 107, 107' are formed at interface regions/mating surfaces 118, 118' through the creation of van der Waals bond formation.

FIG. 2C depicts a formation process 111 wherein a first layer 112 may be formed on top surfaces of the first, second and third dies 102, 104, 106. In some embodiments, the first layer 112 may be formed on the second sides 103, 103' and sidewalls of the second die 104 and third die 106. The first layer 112 may be formed on the first side 121 of the first die adjacent the sidewalls of the first and second dies 104, 106 and may be formed on a region 115 of the first die 102 between the second and third dies 104, 106. In some embodiments, the first layer 112 may be directly on the first die 102, and in other embodiments may be formed on a portion of the first die dielectric material 113. In some embodiments the first layer 112 may comprise an etch stop layer and may comprise a dielectric material. In some embodiments the first layer 112 may comprise one or more of a silicon carbon or a nitrogen material, but the first layer 112 may comprise any material that is suitable for an etch stop prior to the formation of an oxide material.

In some embodiments, the first layer 112 may comprise a silicon nitride material and may comprise a thickness of less than about 150 nm. In other embodiments, the first layer 112 may comprise any suitable etch stop material, either organic or inorganic, and may comprise a thickness of between about 50 nm to about 150 nm. FIG. 2D depicts a formation process 130 wherein a second layer 132 is formed on the first layer 112. The second layer 132 may comprise an inorganic dielectric material such as a silicon oxide material, for example. The second layer 132 does not contain an organic dielectric material in some embodiments. In some embodiments, the second layer may be over top surfaces 103, 103' of the second die 104 and the third die 106. In some embodiments, the second layer 132 is over the first die 102 in a region 115 between the first and second dies 104, 106. Replacing a mold with a wafer level fabrication process of stronger inorganic dielectric layer will reduce stress between the second and third die and thus reduces impact on transistor performance, due to enhanced CTE matching between the second layer 132 and the first second and third die.

Figure 2F:
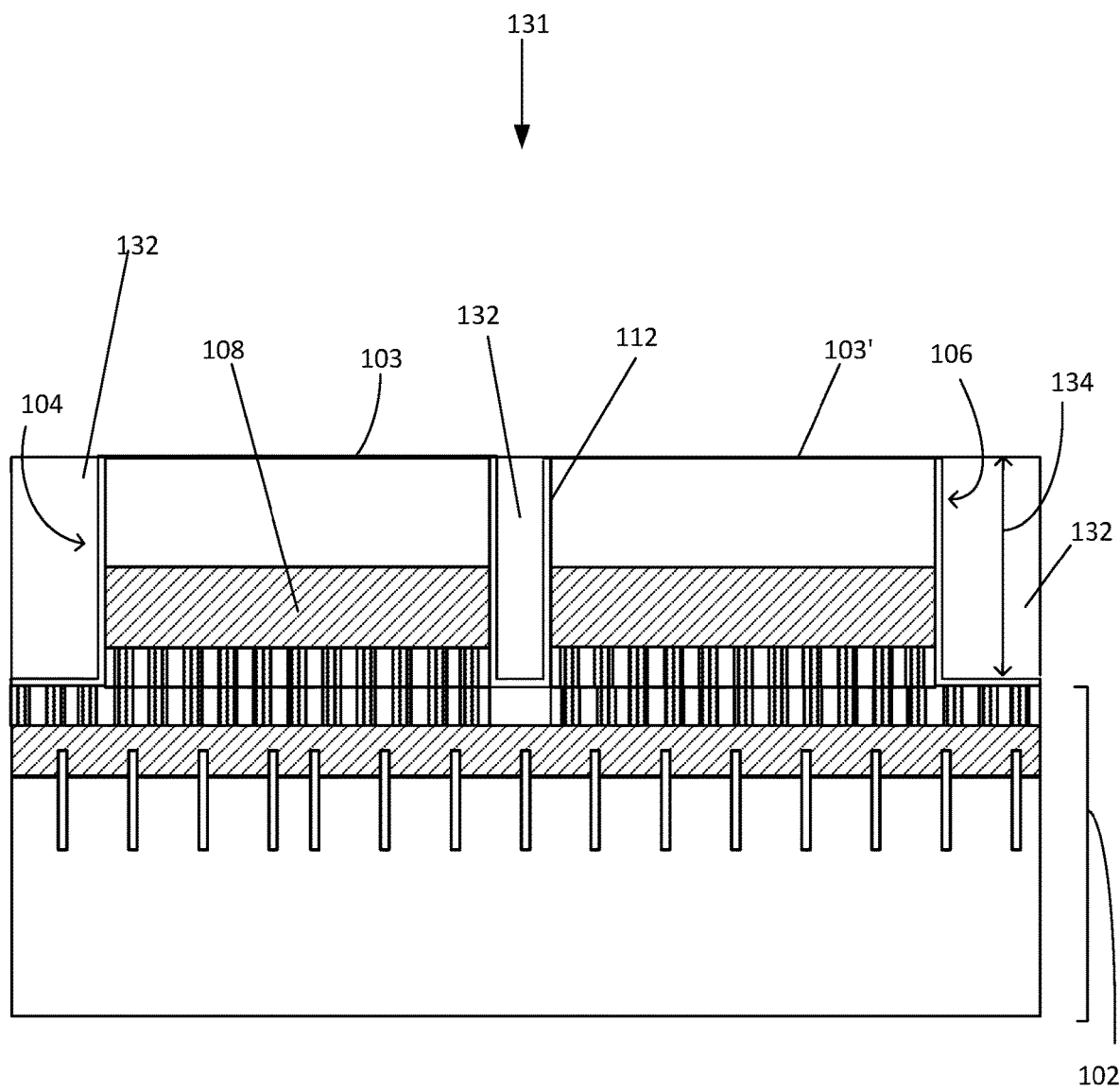
Figure 2G:
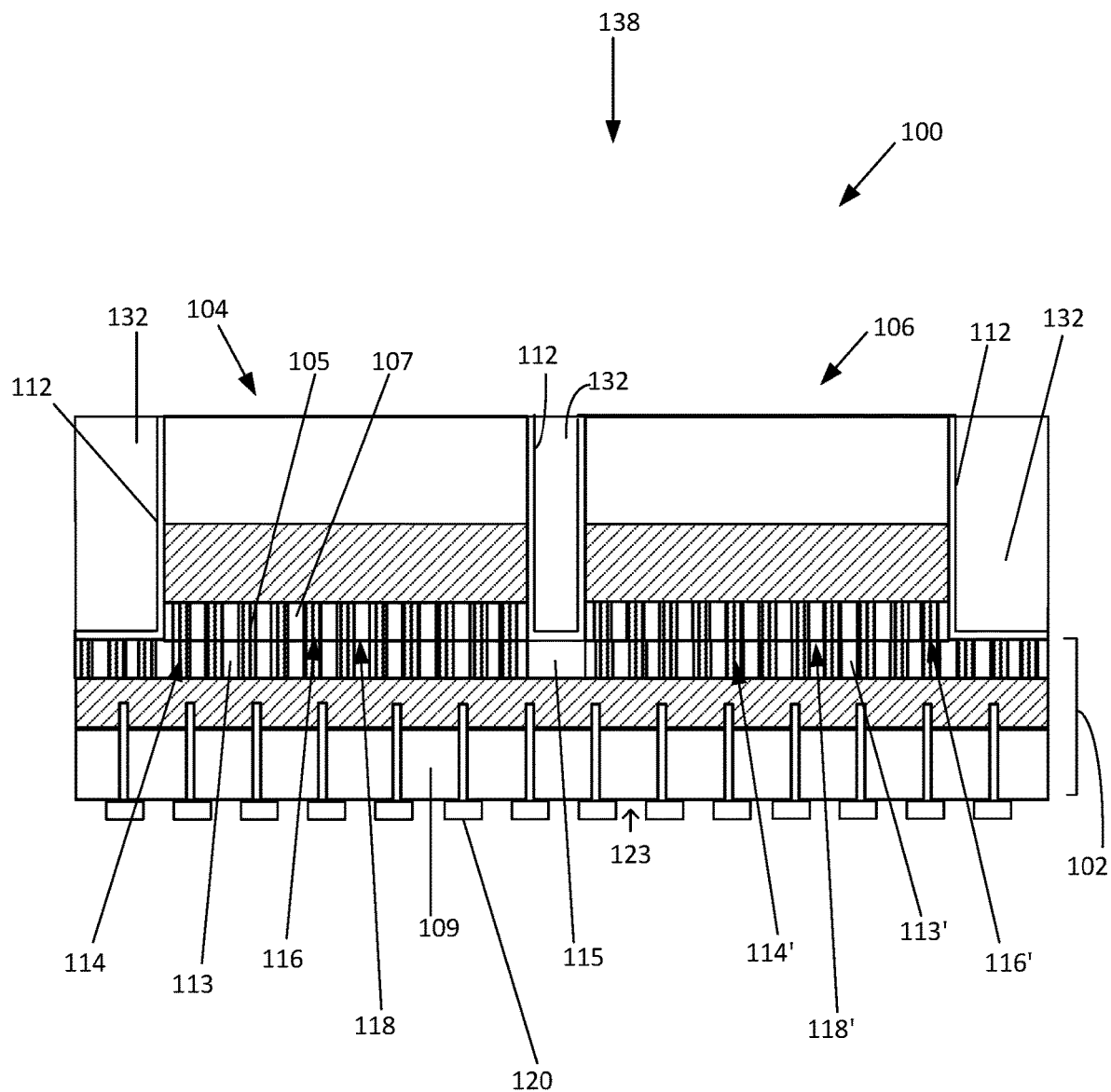

FIGS. 2E-2F depict a planarization process 131. The planarization process 131 removes a portion of the second layer 132 such that a height 134 of the second layer 132 is substantially coplanar with a top surface of the first layer 112 (FIG. 2E), and in some embodiments the planarization process 131 removes a portion of the second layer 132 such that a height 134 of the second layer 132 is substantially coplanar with top surfaces 103, 103' of the second and third dies 104, 106 (FIG. 2F). FIG. 2G depicts a pad formation process layer 138 in which the bulk silicon portion 109 of the first die 102 is ground down and pads 120 are formed according to any suitable grinding and pad formation process as are known in the art. The pads 120 may compose any suitable conductive material and alloys thereof, including copper, for example. The pads 120 are available for conductively coupling the 3D stacked die package structure 100 to any suitable interface, such as an interposer and/or system componentry.

Figure 3A:
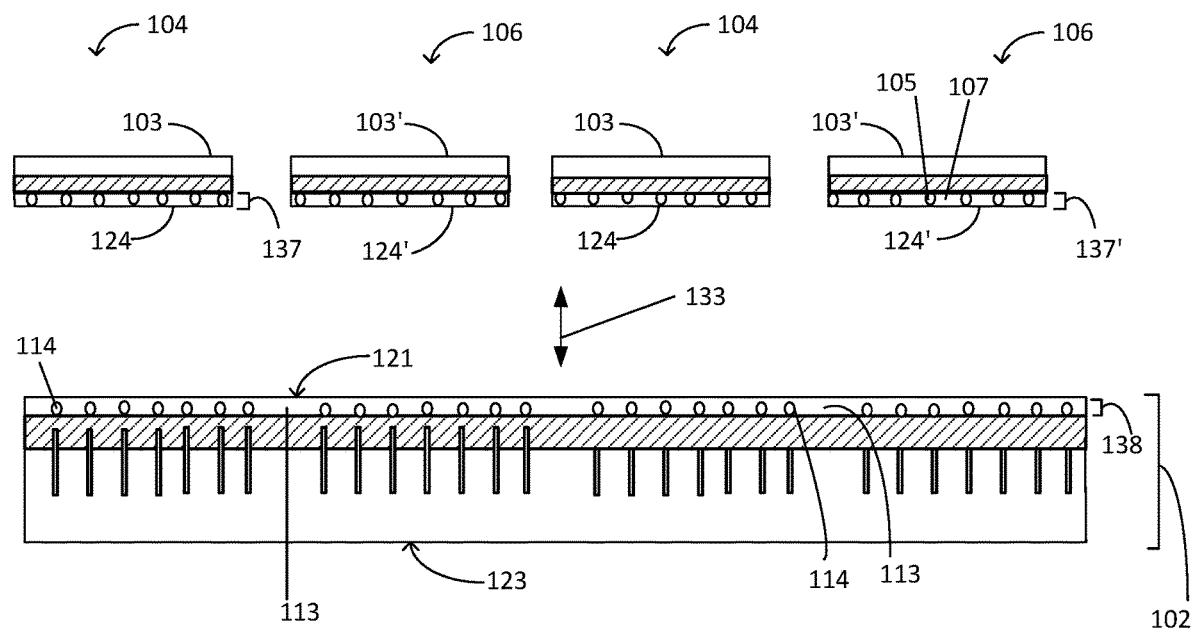
FIGS. 3A-3G illustrate cross-sectional views of forming stacked die assemblies comprising an inorganic fill material, in accordance with some embodiments.

FIGS. 3A-3G depict methods of forming a stacked die package structure according to some embodiments. In FIG. 3A, a substrate 102, which may comprise a wafer in some embodiments, or any other suitable package substrate structure, and may comprise a first die bonding layer 138. The bonding layer 138 may comprise one or more first die conductive structures 114 and first die dielectric material 113, wherein the first die conductive structures 114 are separated by the first die dielectric material 113. The first die 102 may comprise a first side 121 and a second side 123. One or more second die 104 and adjacent third die 106 may be provided for attachment to the first die 102.

The one or more second die 104 and third die 106 may comprise first sides 124, 124' and second sides 103, 103' respectively. The second and third dies 104, 106 comprise a second and a third bonding layers 137, 137'. The second and third die bonding layers 137, 137' may comprise one or more second and third die conductive structures 105, 105' and second and third die dielectric material 107, 107', wherein the second and third die conductive structures 105, 105' are separated by the second die dielectric material 113, 113'.

Figure 3B:
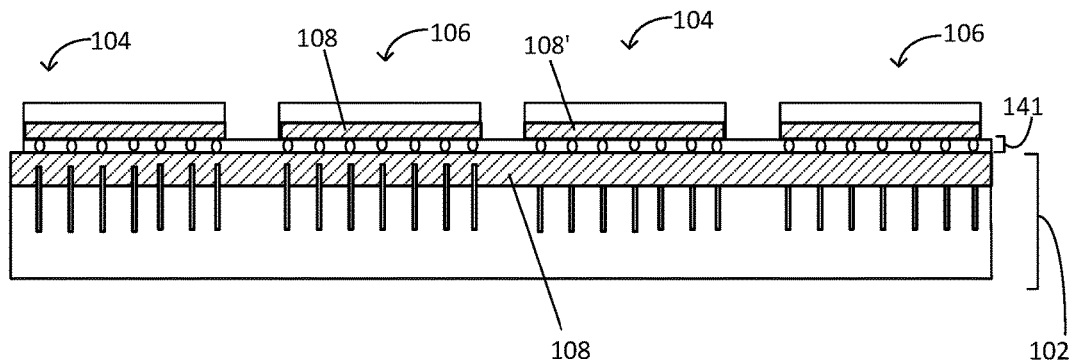

The hybrid bonding process 133 may comprise a first step wherein oxide to oxide bonding between first die dielectric material 113 and second and third die dielectric material 107, 107' may be formed by application of van Der Waal's force between the dielectric materials of the first die and the second and third die. In some embodiments, the van der Waals bonding may be performed at room temperature. In some embodiments, low temperature compression may be used to form the oxide to oxide bonds between the first die and the second and third die. In a second step of process 133, a higher temperature thermal compression step may be performed to form metal to metal bonds between the first die conductive structures 114 and second and third die conductive structures 105, 105'. FIG. 3B depicts the hybrid bond layer 141 that is formed between first, second and third dies 102, 104, 106. The hybrid bond layer 141 may electrically and physically couple the first die active area 108 to the second and third die active areas 108', 108".

Figure 3C:
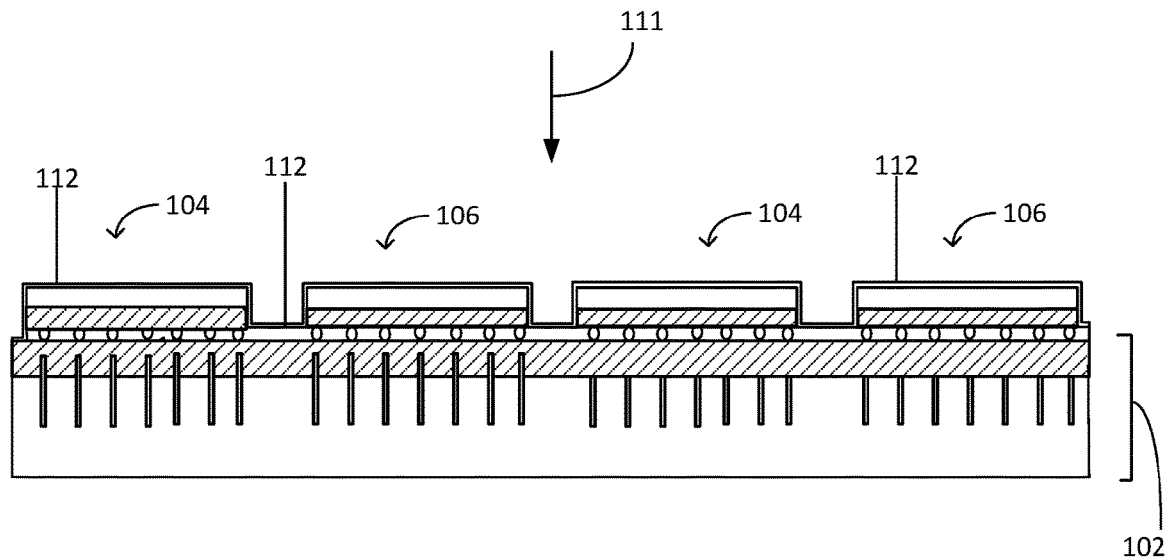

FIG. 3C depicts a formation process 111 wherein a first layer 112 is formed on the first side of the first die 102, and on the second sides 103, 103' of the second and third dies 104, 106. The first layer 112 may comprise an inorganic dielectric material in some embodiments but may comprise any suitable material that may provide an etch stop material. Such materials as silicon nitride and/or silicon oxynitride and the like may be utilized in order to form the first layer 112. In some embodiments, the first layer 112 may be formed using a chemical vapor deposition (CVD) process and/or an atomic layer deposition (ALD) process. In some embodiments, the first layer 112 may comprise a thickness of between about 50 nm to about 150 nm. In an embodiment, first layer 112 may comprise a conformal silicon nitride layer.

Figure 3D:
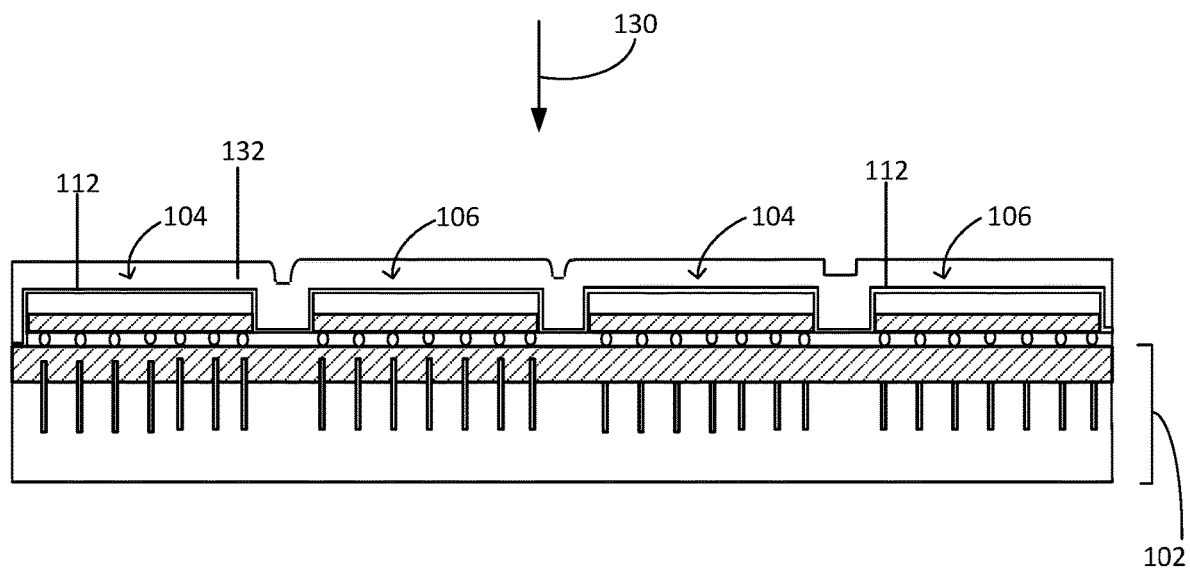
Figure 3E:
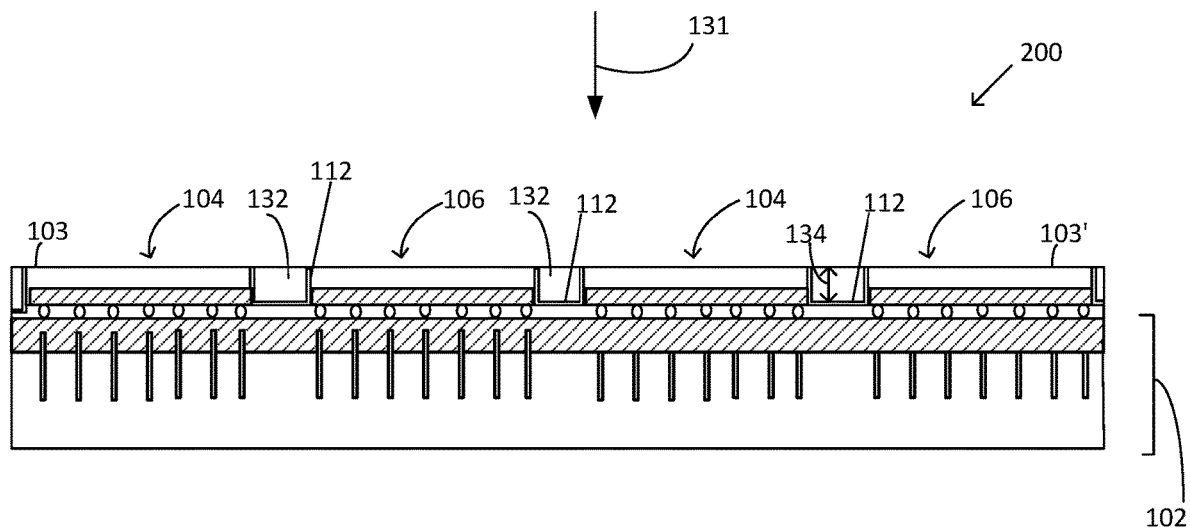

FIG. 3D depicts the formation of a second layer 132 on the first layer 112 by utilizing an inorganic dielectric formation process 130. In some embodiments, the second layer 132 may comprise a silicon oxide material and may be formed by a CVD process or a spin on glass process, for example. In some embodiments, the second layer 132 may comprise any suitable material with a CTE that is within 10 percent of a CTE of the second or third die 104, 106. In some embodiments, the second layer 132 may comprise a CTE of within 10 percent of a CTE of silicon. FIG. 3E depicts a planarization process 131. In some embodiments, the planarization process 131 may comprise a chemical planarization process (CMP) wherein a portion of the second layer 132 may be removed such that a height 134 of the second layer 132 may be substantially coplanar with top surfaces 103, 103' of the second and third dies 104, 106.

Figure 3F:
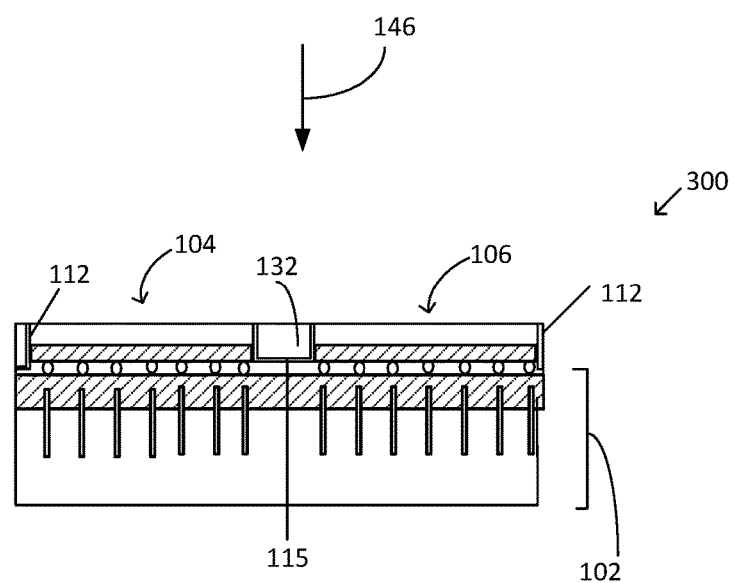
Figure 3G:
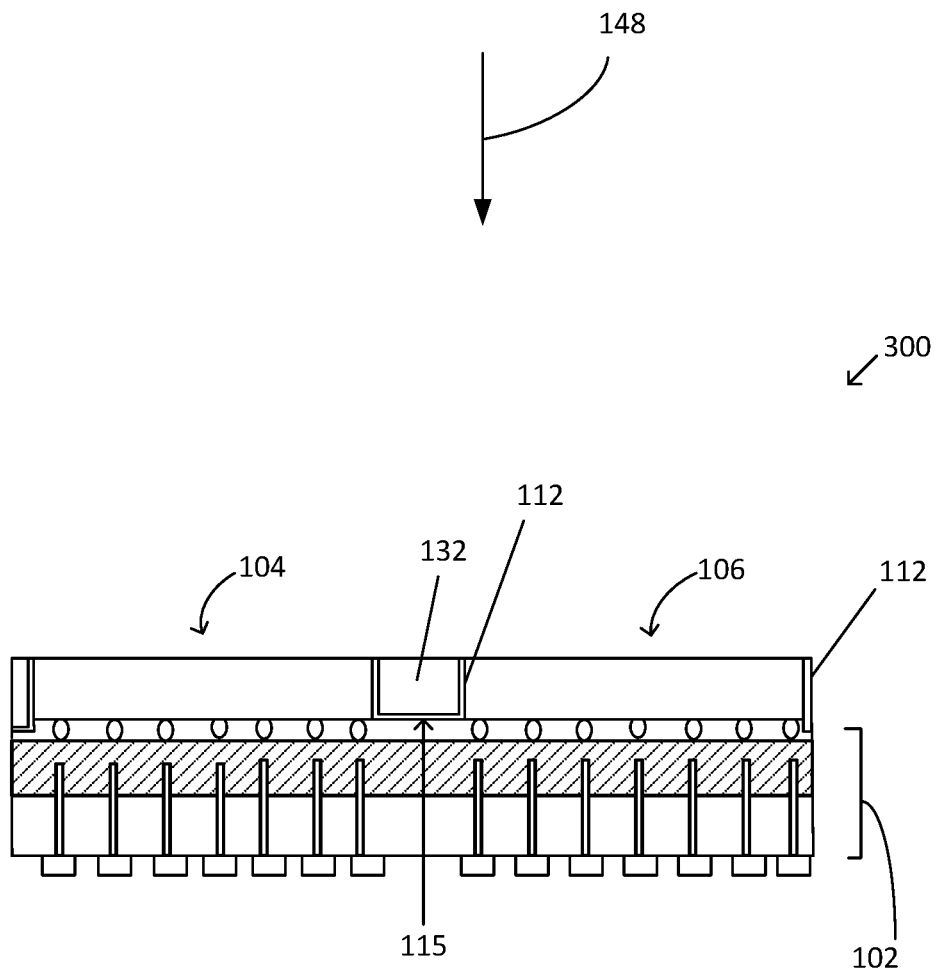

FIG. 3F depicts a 3D stacked die package structure 300 subsequent to a singulation process 146 of the wafer structure 200 of FIG. 3E. The 3D stacked die package structure 300 comprises an inorganic dielectric layer 132 with a height that is substantially coplanar with top surfaces of the second and third die 104, 106. The 3D stacked die package structure 300 comprises a portion of the inorganic dielectric layer 132 that is in a region 115 between the second and third dies 104, 106. FIG. 3G depicts the 3D stacked die package structure 300 subsequent to a pad formation process 148, as are well known in the art.

Figure 4:
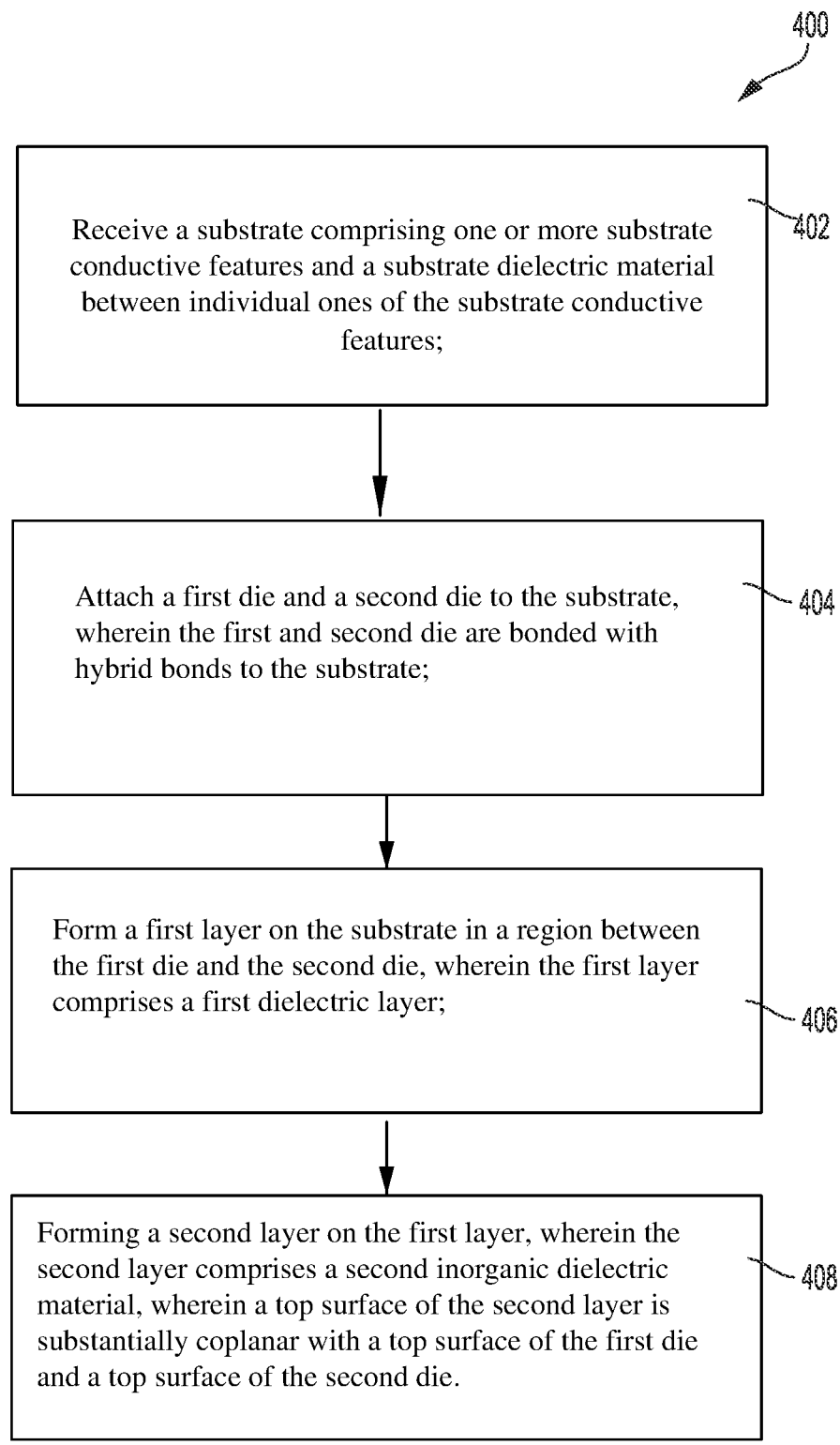
FIG. 4 illustrates a flow chart of a process that includes forming stacked die assemblies comprising an inorganic fill material, in accordance with some embodiments.

FIG. 4 is a flow chart of a process 400 of fabricating a stacked die package structure according to some embodiments. As set forth in block 402, a substrate may be received comprising one or more substrate conductive features and a substrate dielectric material between individual ones of the substrate conductive features. As set forth in block 404, a first die and a second die may be attached to the substrate wherein the first and second die are bonded with hybrid bonds to the first die. A first layer may be formed on the substrate in a region between the first die and the second die, wherein the first layer comprises a first dielectric layer as set forth in block 406. As set forth in block 408 a second layer may be formed on the first layer. The second layer may comprise a second inorganic dielectric material, wherein a top surface of the second layer is substantially coplanar with a top surface of the first die and a top surface of the second die.

Figure 5:
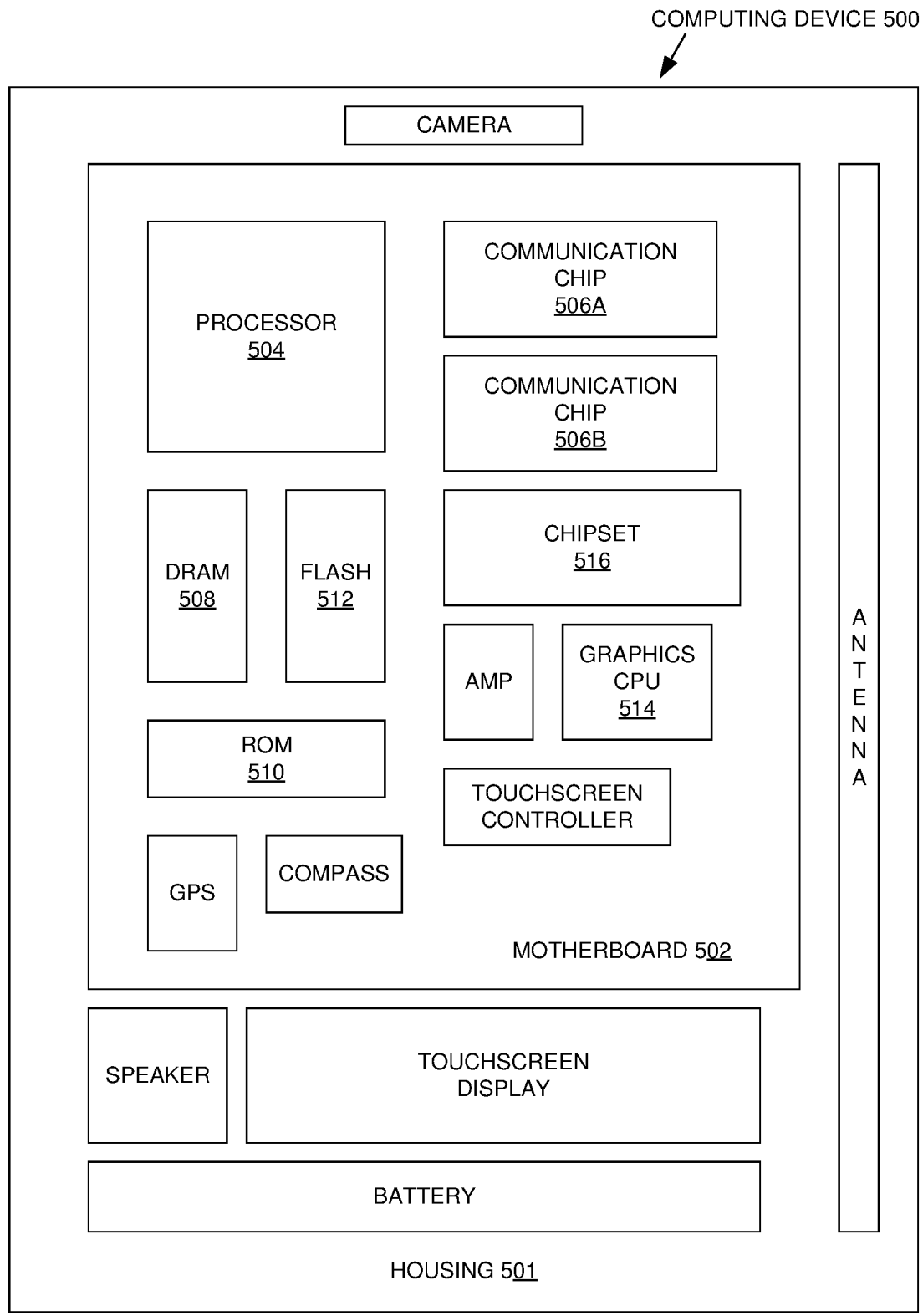
FIG. 5 is a functional block diagram of an electronic computing device, in accordance with some embodiments.

FIG. 5 illustrates an electronic or computing device 500 in accordance with one implementation of the present description. The computing device 500 may include a housing 501 having a motherboard 502 disposed therein. The computing device 500 may include a number of integrated circuit components/system components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery and/or a power supply, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the motherboard 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having a stacked die package structure, wherein the stacked die package structure may comprise a first die with one or more first die conductive structures and a first die dielectric material between individual ones of first die conductive structures. A second die and a third die may be directly on the one or more first die conductive structures. A first layer is on the first die between the second die and the third die. A second layer is directly on the first layer, the second layer comprising an inorganic dielectric material with a top surface substantially coplanar with the top surfaces of the second die and the third die.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-5. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein first example is a microelectronic package structure comprising a first die with one or more first die conductive structures and a first die dielectric material between individual ones of first die conductive structures. A second die comprises a first side and a second side, the first side comprising one or more second die conductive structures directly on the one or more first die conductive structures. A third die is adjacent to the second die, the third die comprising a first side and a second side, the first side comprising one or more third die conductive structures directly on the one or more first die conductive structures. A first layer is directly on the second side of the first die and is directly on the second side of the third die, the first layer comprising a first inorganic dielectric material. A second layer is directly on the first layer, the second layer comprising a second inorganic dielectric material with a top surface substantially coplanar with the second side of the second die and the second side of the third die.

In second examples, the first example can optionally include the first layer directly on the first die between the second die and the third die and is directly on a sidewall of the second die and directly on a sidewall of the third die.

In third examples, for any of the first examples the first layer comprises an etch stop material.

In fourth examples, for any of the first examples a third die dielectric material is between the one or more third die conductive structures and is directly on the first die dielectric material.

In fifth examples, for any of the first examples an interface between individual ones of the one or more conductive structures of the second die and individual ones of the first die comprise a metal to metal bond, and wherein an interface region between the first die dielectric material and the second die dielectric material comprises an insulator bond.

In sixth examples, for any of the first examples the second layer comprises silicon and oxygen.

In seventh examples, for any of the first examples the second layer comprises at least one of an inorganic oxide material or an inorganic spin on glass material.

In eighth examples, for any of the first examples the first layer comprises at least one of a nitride material or an oxynitride material.

In ninth examples, for any of the first examples the first layer comprises a thickness between 50 nm to 100 nm.

In tenth examples, for any of the first examples a height of the second layer is no greater than a height of the second die.

In eleventh examples a computer system comprises power supply, a system component comprising interconnect circuitry, and one or more integrated circuit packages coupled to the power supply through the system component, wherein at least one of the integrated circuit packages further comprises a first die comprising one or more first die conductive structures and a first die dielectric material between individual ones of the first die conductive structures. A second die comprises a first side and a second side, the first side comprising one or more second die conductive structures directly on the one or more first die conductive structures. A third die is adjacent to the second die, and a first layer is on a region of the first die between the second die and the third die, wherein the first layer comprises a first inorganic dielectric material. A second layer is over the first layer, wherein the second layer comprises a second inorganic dielectric material, wherein a top surface of the second layer is substantially coplanar with the second side of the second die and the second side of the third die.

For any of the tenth examples the first face is to be substantially parallel to a vertical output coupler of the PIC chip when the contact alignment surface is in contact with the complementary detent or protrusion.

In twelfth examples, for any of the eleventh examples a coefficient of thermal expansion (CTE) of the second layer is substantially the same as a CTE of the first die or a CTE of the second die.

In thirteenth examples, for any of the eleventh examples the first layer is on the sidewall of the second die between the second die and the third die and is on the sidewall of the third die between the second die and the third die.

In fourteenth examples, for any of the eleventh examples the second layer is on the first die adjacent the second die and adjacent the third die.

In fifteenth examples, for any of the eleventh examples the third die comprises a first side and a second side, wherein the first side of the third die comprises one or more third die conductive structures directly on the one or more first die conductive structures the second layer is directly on the top surface of the second die and is directly on the top surface of the third die, wherein the second layer is on the first die adjacent the second die and adjacent the third die.

In sixteenth examples, a method of fabricating an integrated circuit (IC) structure, comprises receiving a substrate with one or more substrate conductive features and a substrate dielectric material between individual ones of the substrate conductive features, attaching a first die to the substrate, the first die comprises one or more first die conductive features and a first die dielectric material between individual ones of the first die conductive features. Forming an insulator to insulator bond interface between the first die dielectric material and the substrate dielectric material, forming a metal to metal bond interface between the substrate conductive features and the first die conductive features. Attaching and bonding a second die on the substrate, adjacent to the first die. Forming a first layer on a surface of the substrate adjacent the first die and the second die, and forming the first layer between the first die and the second die, wherein the first layer comprises a thickness of less than 150 nm thick, and forming a second layer on the first layer, wherein the second layer comprises an inorganic dielectric material, wherein a top surface of the second layer is substantially coplanar with a top surface of the first die and a top surface of the second die.

In seventeenth examples, for any of the sixteenth examples attaching the first die to the substrate comprising placing individual ones of the first die conductive features on individual ones of the substrate conductive features; and placing the first die dielectric material directly on the substrate dielectric material.

In eighteenth examples, for any of the sixteenth examples attaching and bonding a second die on the substrate comprises placing individual ones of one or more second die conductive features on individual ones of the substrate conductive features, wherein the second die further comprises second die dielectric material between the individual ones of the second die conductive features, placing the second die dielectric material directly on the substrate dielectric material, forming an insulator to insulator bond interface between the second die dielectric material and the substrate dielectric material, and forming a metal to metal bond interface between the substrate conductive features and the second die conductive features.

In nineteenth examples for any of the sixteenth examples wherein the second layer comprises at least one of an inorganic oxide material or an inorganic spin on glass material.

In twentieth examples for any of the sixtieth examples wherein the first layer comprises at least one of a nitride material or an oxynitride material.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A microelectronic package structure comprising:
   a first die comprising one or more first die conductive structures and a first die dielectric material between individual ones of the first die conductive structures;
   a second die comprising a first side and a second side, wherein the first side of the second die comprises one or more second die conductive structures directly on a first set of the one or more first die conductive structures;
   a third die adjacent to the second die, the third die comprising a first side and a second side, wherein the first side of the third die comprises one or more third die conductive structures directly on a second set of the one or more first die conductive structures;
   a first layer directly on the first die between the second die and the third die, wherein the first layer comprises a first inorganic dielectric material; and
   a second layer directly on the first layer, wherein the second layer comprises a second inorganic dielectric material, wherein a top surface of the second layer is substantially coplanar with the second side of the second die and the second side of the third die.

2. The microelectronic package structure of claim 1, wherein the first layer is directly on a sidewall of the second die and is directly on a sidewall of the third die.

3. The microelectronic package structure of claim 1, wherein the first layer comprises an etch stop material.

4. The microelectronic package structure of claim 1, wherein a third die dielectric material is between the one or more third die conductive structures and is directly on the first die dielectric material.

5. The microelectronic package structure of claim 1 wherein an interface between individual ones of the one or more second die conductive structures and individual ones of the first set of the first die conductive structures comprises a metal to metal bond, and wherein an interface region between the first die dielectric material and a second die dielectric material comprises an insulator bond, wherein the second die dielectric material is between individual ones of the second die conductive structures.

6. The microelectronic package structure of claim 1 wherein the second layer comprises silicon and oxygen.

7. The microelectronic package structure of claim 1 wherein the second layer comprises at least one of an inorganic oxide material or an inorganic spin on glass material.

8. The microelectronic package structure of claim 1 wherein the first layer comprises at least one of a nitride material or an oxynitride material.

9. The microelectronic package structure of claim 1 wherein the first layer comprises a thickness between 50 nm to 150 nm.

10. The microelectronic package structure of claim 1 wherein a height of the second layer is no greater than a height of the second die and is no greater than a height of the third die.

* * * * *